(12) United States Patent
Kim et al.

(10) Patent No.: US 11,650,271 B1
(45) Date of Patent: May 16, 2023

(54) MAGNETIC SENSOR BASED ON WHEATSTONE BRIDGE AND MANUFACTURING METHOD THEREOF

(71) Applicant: EV ADVANCED MATERIAL CO., LTD., Daegu (KR)

(72) Inventors: CheolGi Kim, Daegu (KR); Byeonghwa Lim, Daegu (KR); Jaehoon Lee, Daegu (KR); Changyeop Jeon, Daegu (KR); Taehyeong Jeon, Daegu (KR)

(73) Assignee: EV ADVANCED MATERIAL CO., LTD., Daegu (KR)

( * ) Notice: Subject to any disclaimer, the term of this patent is extended or adjusted under 35 U.S.C. 154(b) by 0 days.

(21) Appl. No.: 17/708,155

(22) Filed: Mar. 30, 2022

(51) Int. Cl.
 *G01R 33/09* (2006.01)
 *G01R 33/00* (2006.01)

(52) U.S. Cl.
 CPC ....... *G01R 33/091* (2013.01); *G01R 33/0029* (2013.01); *H10N 50/01* (2023.02)

(58) Field of Classification Search
 CPC ... H10N 50/01; G01R 33/0029; G01R 33/091
 See application file for complete search history.

(56) References Cited

U.S. PATENT DOCUMENTS 5,877,705 A * 3/1999 Sampey ................. G01R 33/09
 324/253

FOREIGN PATENT DOCUMENTS

KR        10-1863602        6/2018

\* cited by examiner

*Primary Examiner* — Alesa Allgood
(74) *Attorney, Agent, or Firm* — Lex IP Meister, PLLC

(57) ABSTRACT

The present invention relates to a magnetic sensor based on a Wheatstone bridge and a manufacturing method thereof. The magnetic sensor according to an embodiment includes a magnetic field sensing unit that is provided with a plurality of magneto resistors forming a resistance bridge, a magneto resistor monitoring unit that monitors resistance values of the plurality of magneto resistors, and an offset adjusting unit that adjusts a resistance value of a thin film variable resistor connected to at least one terminal among a plurality of current terminals provided in the resistance bridge based on the monitoring result of the resistance values.

10 Claims, 10 Drawing Sheets

[FIG.1]
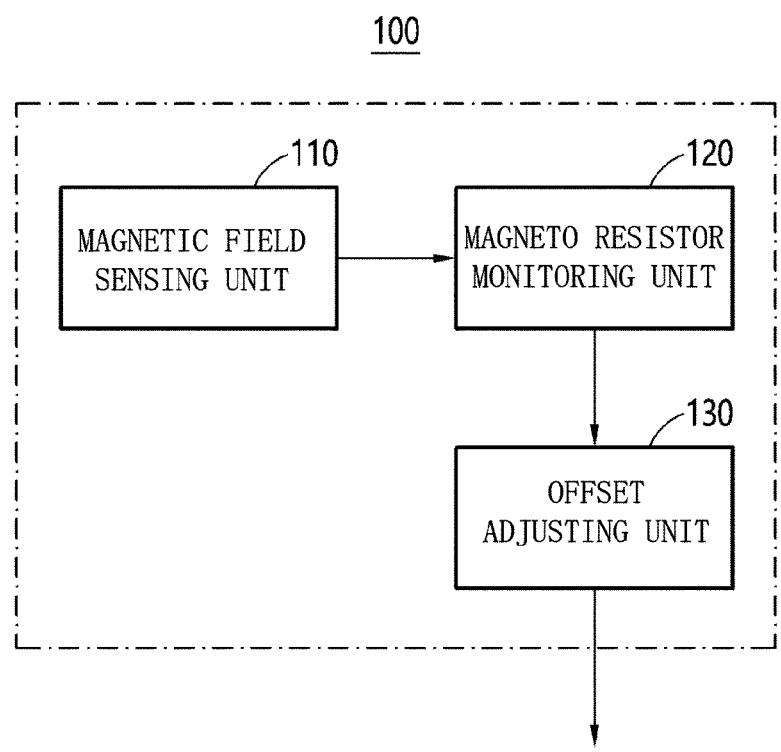

[FIG.2a]
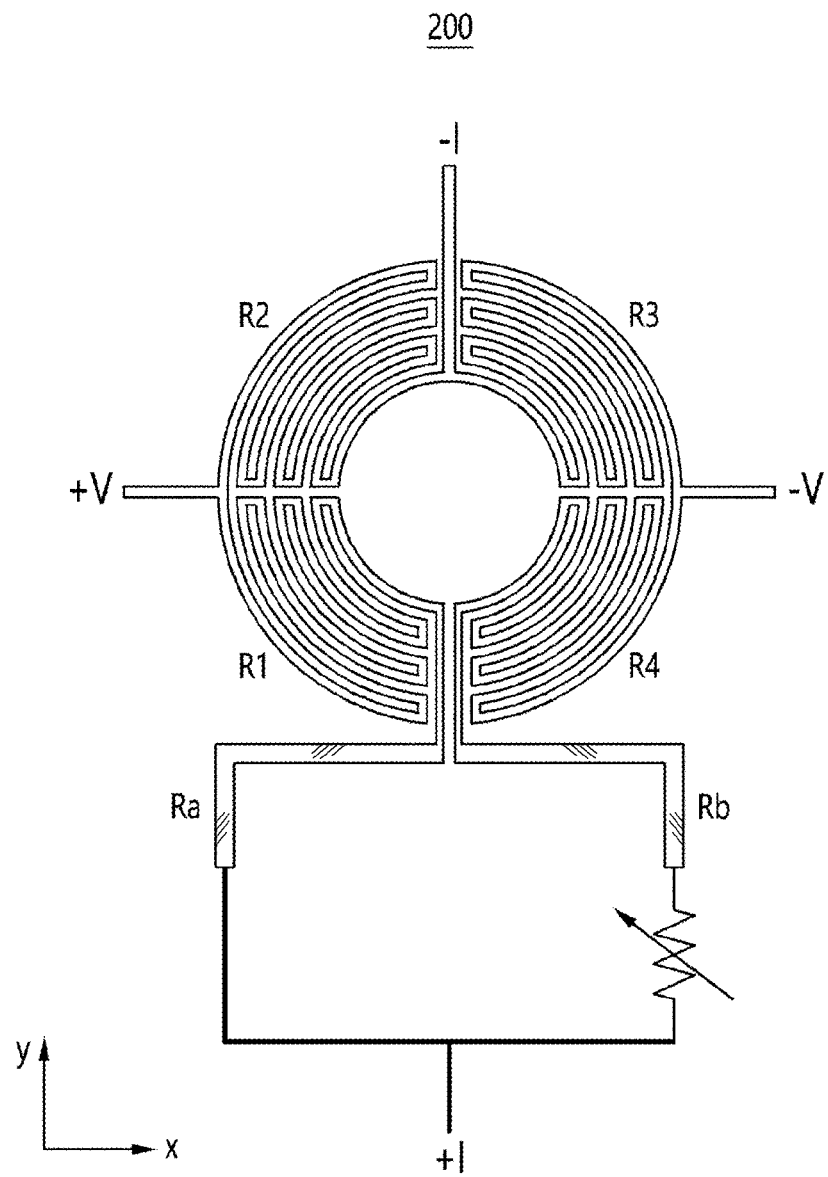

【FIG.2b】
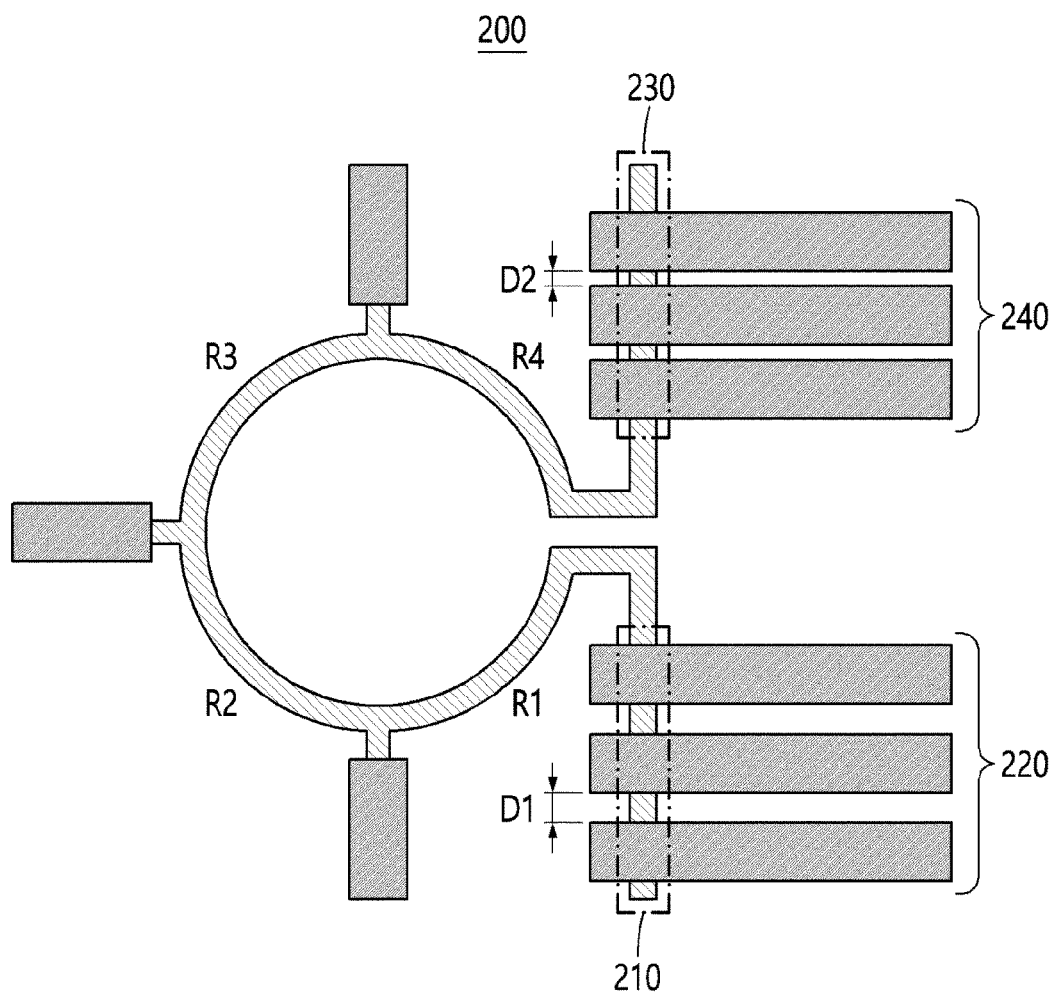

[FIG.3]
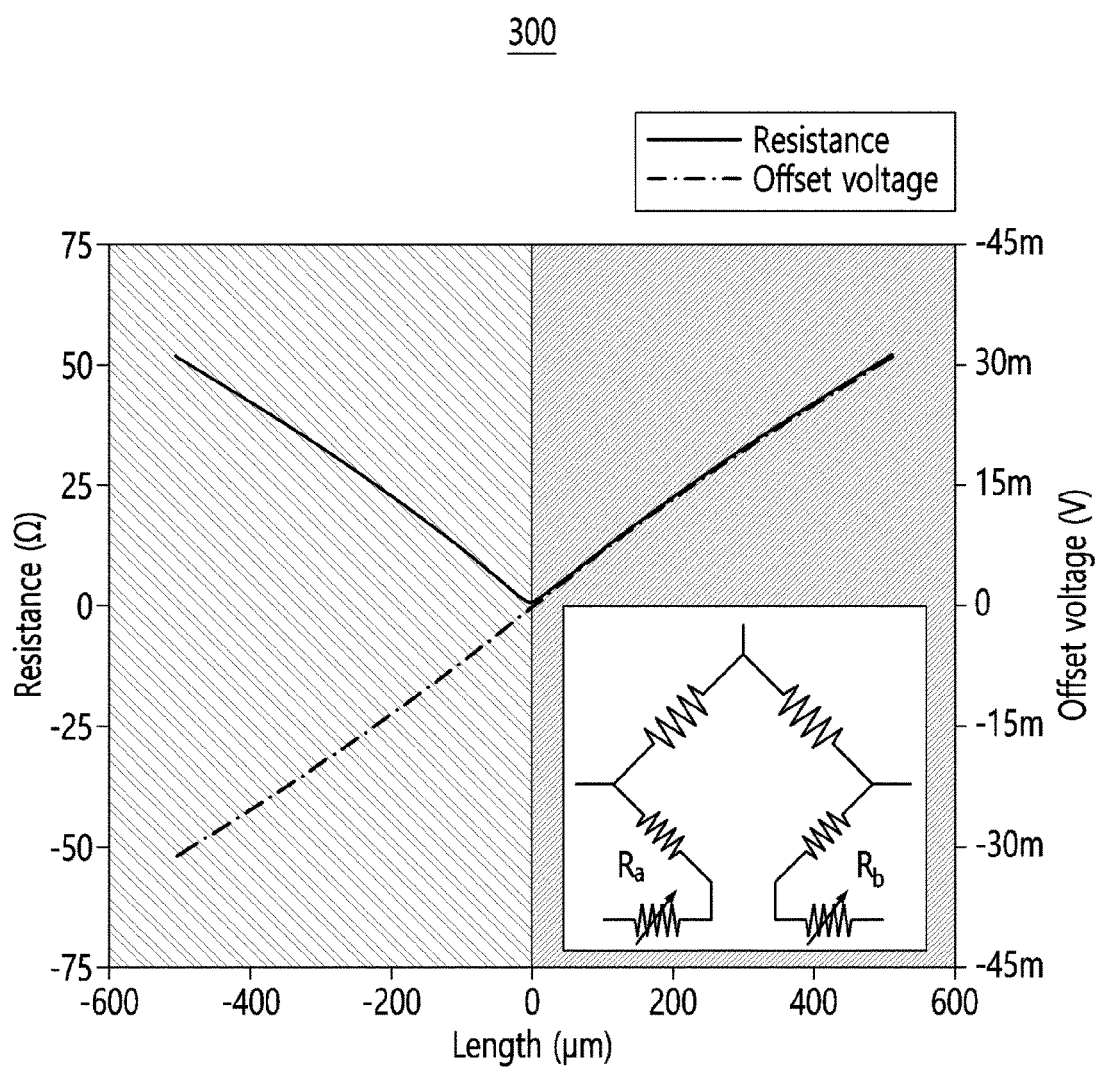

【FIG.4a】
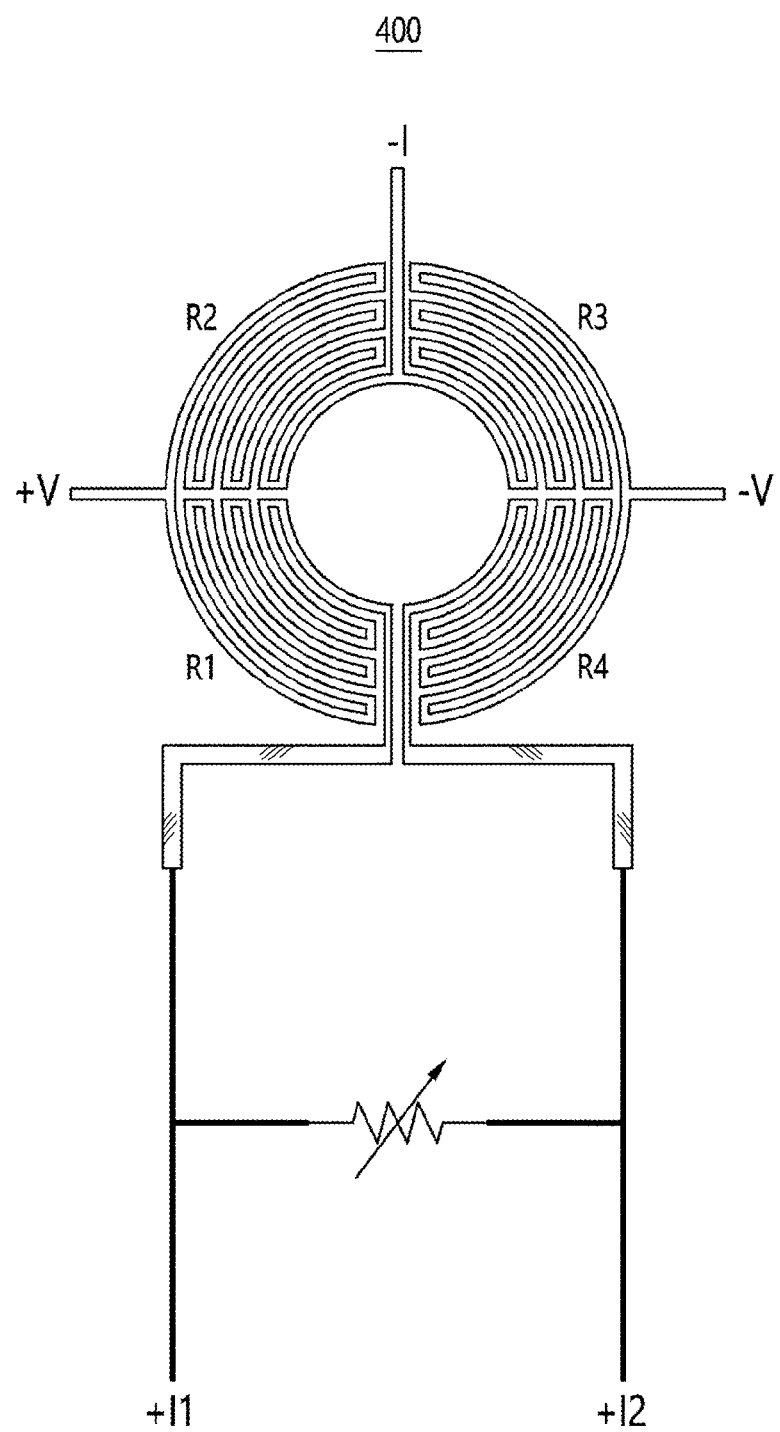

[FIG.4b]
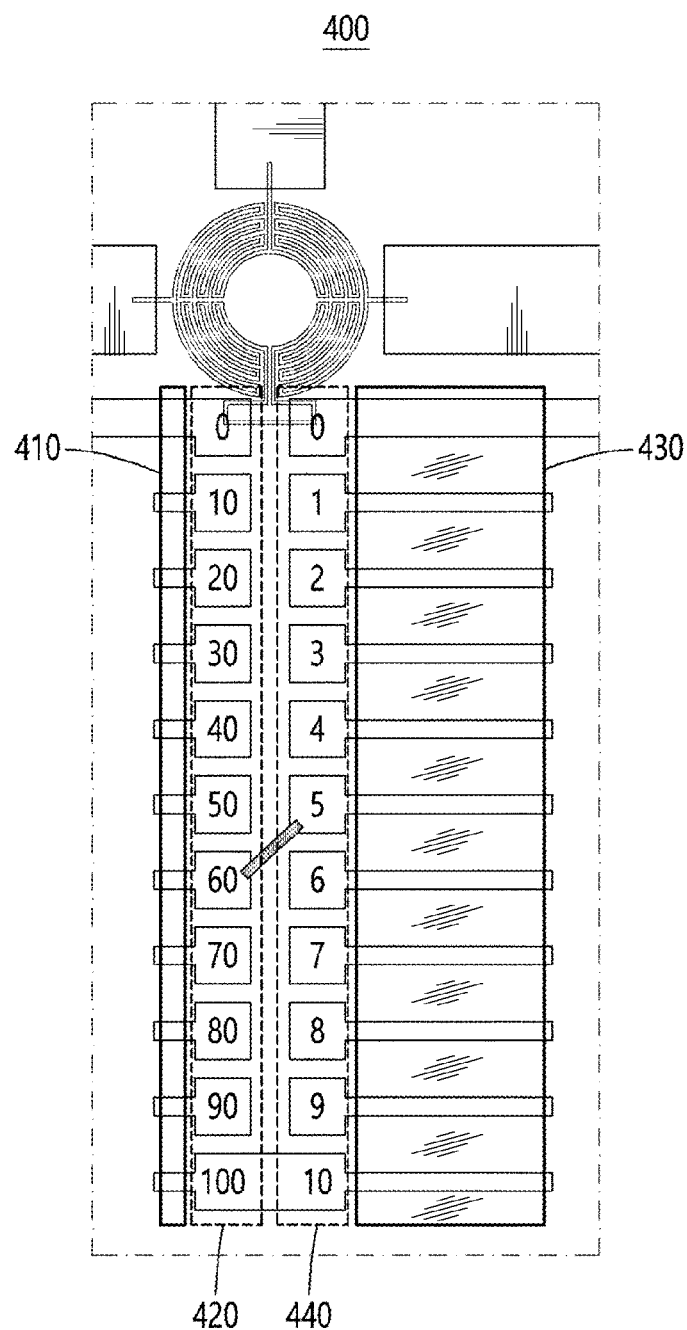

[FIG.5]
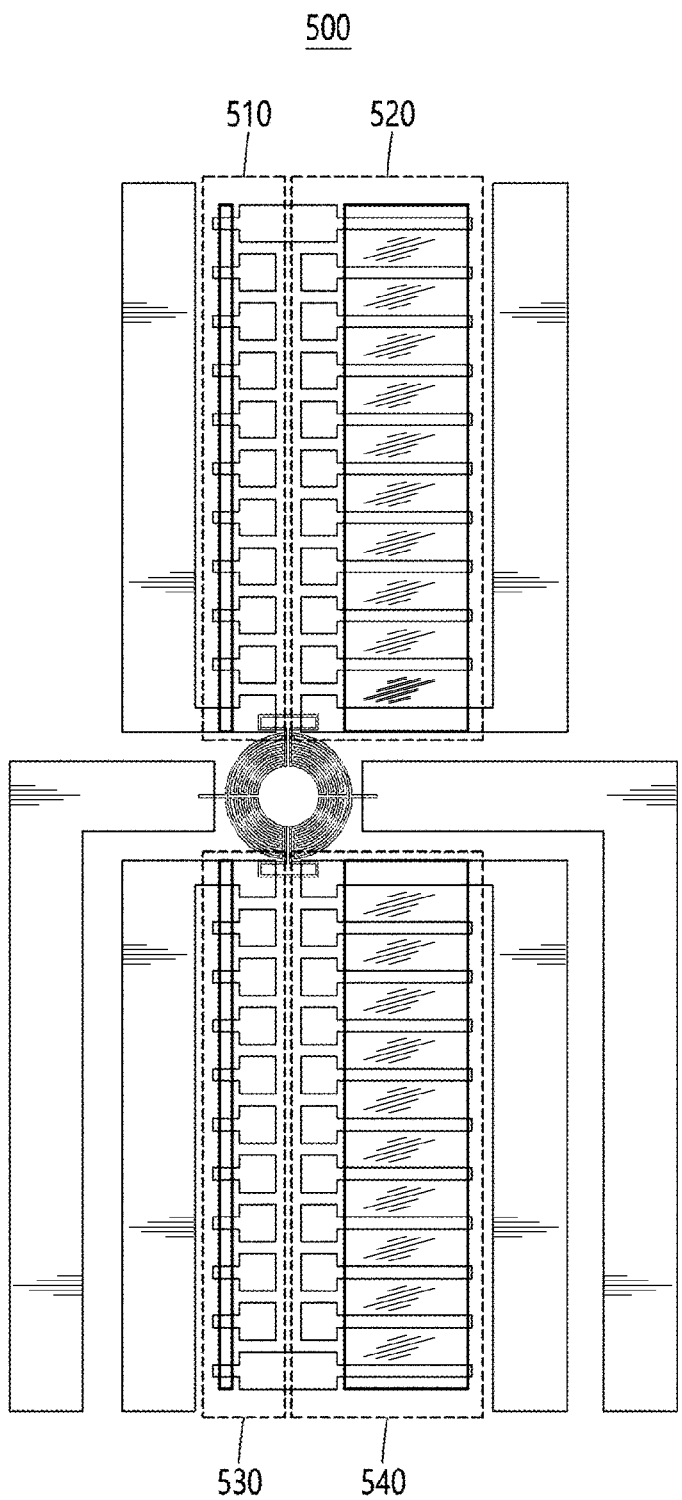

【FIG.6】
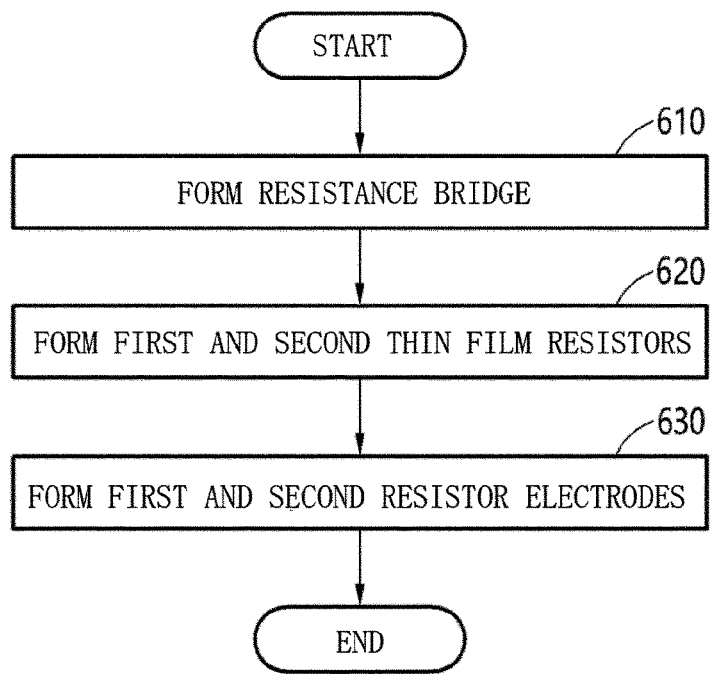
【FIG.7a】
710
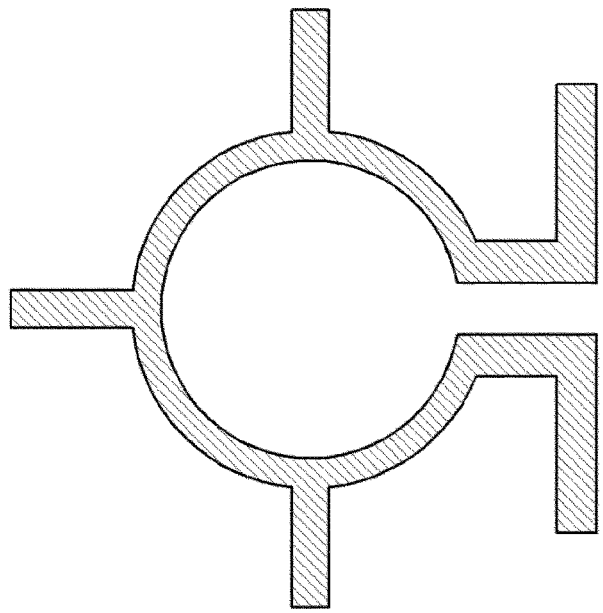

【FIG.7b】
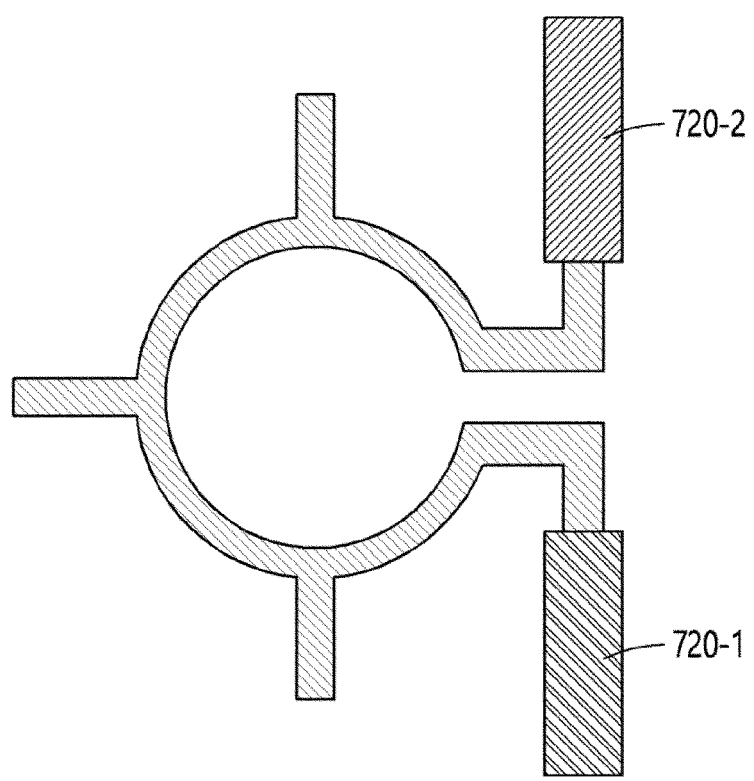

[FIG.7c]
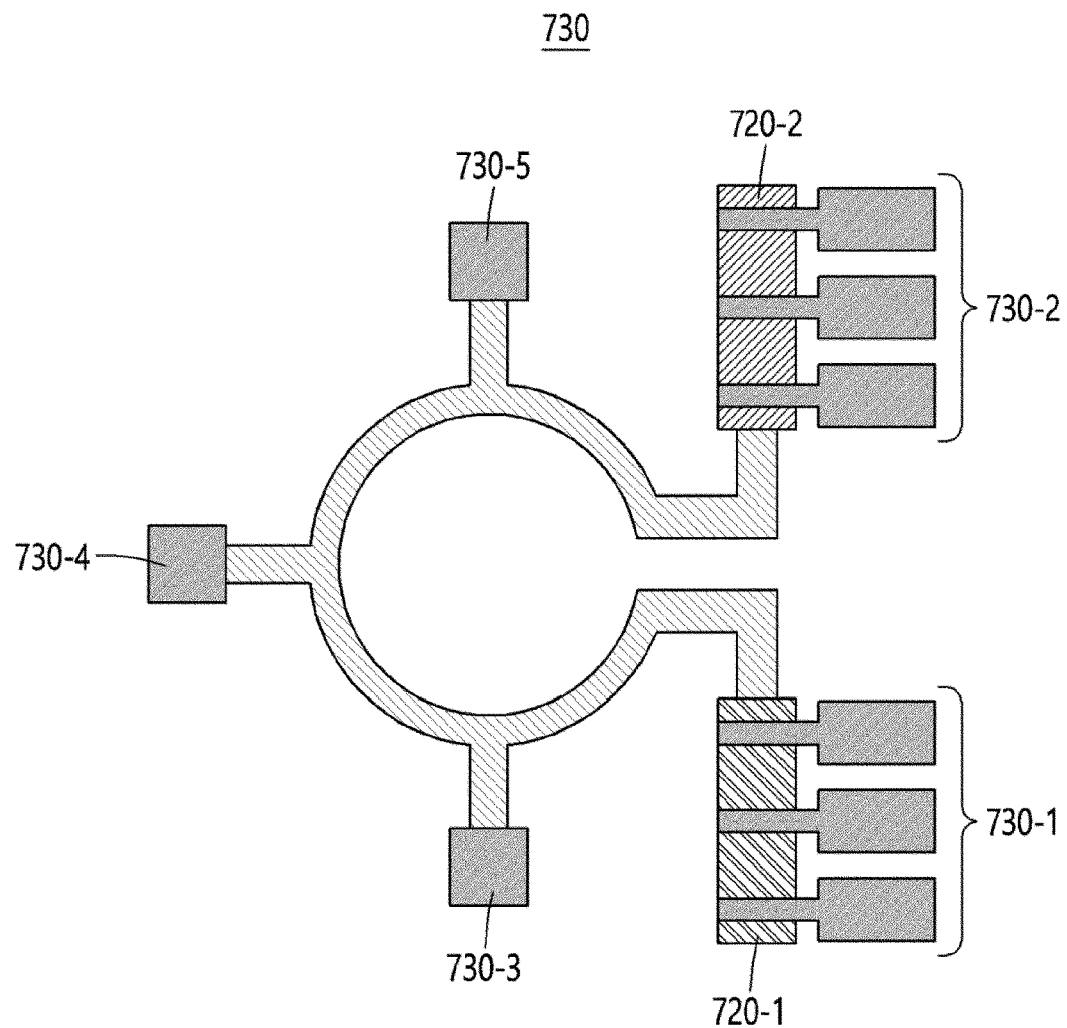

MAGNETIC SENSOR BASED ON WHEATSTONE BRIDGE AND MANUFACTURING METHOD THEREOF

BACKGROUND OF THE INVENTION

1. Field of the Invention

The present invention relates to a magnetic sensor based on a Wheatstone bridge and a manufacturing method thereof, and more particularly, to a technical idea of correcting an offset in the magnetic sensor based on the Wheatstone bridge.

2. Description of the Related Art

Recently, the magnetic sensor has been used in various fields such as automotive industry, magnetic communication, noninvasive brain mapping, evaluation of nondestructive materials, geomagnetic field and on-site diagnostics, etc., and thus, research on offset correction technology is continued in order to improve the accuracy of magnetic field sensing.

Specifically, in order to accurately detect a value of a magnetic field from the magnetic sensor, a technique for correcting a sensor output value with a zero offset or the same offset is required. Accordingly, the offset of the magnetic sensor was corrected by using an offset correction circuit additionally attached to the magnetic sensor in Korea Patent No. 10-1863602, "A magnetic field sensor for adjusting sensitivity and/or offset according to temperature and method therefor", for example.

However, such an offset correction circuit requires a circuit manufacturing/verification process, and there is a problem of causing noise generation due to the attachment of the correction circuit and additional power consumption for driving the correction circuit.

SUMMARY OF THE INVENTION

The invention is intended to provide a magnetic sensor capable of correcting an offset by adjusting a resistance value of a thin film variable resistor through monitoring values of magneto resistors constituting a Wheatstone bridge without an offset correction circuit, and a manufacturing method thereof.

The invention is also intended to provide a magnetic sensor capable of quickly and easily correcting the offset of the sensor through one thin film forming process even when the offset is changed due to environmental noise according to a post-processing step of packaging sensors, or when multiple sensors having different offsets are used, and a manufacturing method thereof.

A magnetic sensor according to an embodiment of the invention may include a magnetic field sensing unit that is provided with a plurality of magneto resistors forming a resistance bridge, a magneto resistor monitoring unit that monitors resistance values of the plurality of magneto resistors, and an offset adjusting unit that adjusts a resistance value of a thin film variable resistor connected to at least one terminal among a plurality of current terminals provided in the resistance bridge based on the monitoring result of the resistance values.

According to one aspect, the thin film variable resistor may include a first variable resistor provided with a first thin film resistor formed from the at least one terminal in a first direction, and a plurality of first resistor electrodes formed on the first thin film resistor at a first interval, and a second variable resistor provided with a second thin film resistor formed from the at least one terminal in a second direction, and a plurality of second resistor electrodes formed on the second thin film resistor at a second interval narrower than the first interval.

According to one aspect, the offset adjusting unit may connect any one electrode among the plurality of first resistor electrodes and any one electrode among the plurality of second resistor electrodes to a wiring corresponding to the at least one terminal based on the monitoring result of the resistance values.

According to one aspect, in the thin film variable resistor, each of the plurality of first resistor electrode and each of the plurality of second resistor electrode may be formed an interval of 1 μm to 1,000 μm.

According to one aspect, the thin film variable resistor may include a first variable resistor provided with a first thin film resistor connected to a first wiring formed from the at least one terminal in a first direction and formed with a first thickness, and a plurality of first resistor electrodes formed on the first thin film resistor at a preset interval, and a second variable provided with a second thin film resistor connected to a second wiring formed from the at least one terminal in a second direction and formed with a second thickness thicker than the first thickness, and a plurality of second resistor electrodes formed on the second thin film resistor at a preset interval.

According to one aspect, the offset adjusting unit may connect any one electrode among the plurality of first resistor electrodes and any one electrode among the plurality of second resistor electrodes to each other based on the monitoring result of the resistance values.

According to one aspect, the plurality of magneto resistors may constitute a Wheatstone bridge, and may include first to fourth magneto resistors respectively provided between the plurality of current terminals and a plurality of voltage terminals.

According to one aspect, the offset adjusting unit may adjust the resistance value of the thin film variable resistor so that a result obtained by reflecting a resistance value of the third magneto resistor to a resistance value of the first magneto resistor is coincident with a result obtained by reflecting a resistance value of the fourth magneto resistor to a resistance value of the second magneto resistor, based on the monitoring result of the resistance values.

According to one aspect, the magnetic field sensing unit may monitor voltages output through the plurality of voltage terminals, and detect a change in a magnetic field based on a result of monitoring the voltages.

A manufacturing method of a magnetic sensor according to an embodiment of invention may include forming a resistance bridge provided with a plurality of magneto resistors, forming a first thin film resistor and a second thin film resistor of a thin film variable resistor on a wiring connected to at least one terminal among a plurality of current terminals provided in the resistance bridge, and forming a plurality of first resistor electrodes on the first thin film resistor and forming a plurality of second resistor electrodes on the second thin film resistor.

According to one embodiment, in the invention, the offset can be corrected by adjusting the resistance value of the thin film variable resistor through the monitoring of values of the magneto resistors constituting the Wheatstone bridge without an offset correction circuit.

In addition, in the invention, the offset of the sensor can be quickly and easily corrected through one thin film forming process even when the offset is changed due to environmental noise according to a post-processing step of packaging sensors, or when multiple sensors having different offsets are used.

BRIEF DESCRIPTION OF THE DRAWINGS

FIG. 1 is a diagram for describing a magnetic sensor according to an embodiment;

FIGS. 2A and 2B are diagrams for describing a magnetic sensor according to a first embodiment;

FIG. 3 is a diagram for describing an offset compensation characteristic according to a change in a resistance value of a thin film variable resistor provided in the magnetic sensor according to the first embodiment;

FIGS. 4A to 4B are diagrams for describing a magnetic sensor according to a second embodiment;

FIG. 5 is a diagram for describing an application example of the magnetic sensor according to the second embodiment;

FIG. 6 is a diagram for describing a manufacturing method of the magnetic sensor according to an embodiment; and FIGS. 7A to 7C are diagrams for describing a manufacturing method of the magnetic sensor according to the first embodiment.

DETAILED DESCRIPTION OF THE EXEMPLARY EMBODIMENTS

Hereinafter, various embodiments of the present document will be described with reference to the accompanying drawings.

Embodiments and terms used therein are not intended to limit the technology described in this document to specific embodiments, and should be understood to include various modifications, equivalents, and/or substitutions of the corresponding embodiments.

In describing various embodiments below, when it is determined that a detailed description of a related known function or configuration may unnecessarily obscure the gist of the invention, the detailed description thereof will be omitted.

In addition, the terms to be described later are terms defined in consideration of functions in various embodiments, which may vary according to intentions or customs of users and operators. Therefore, the definition should be made based on the content throughout this specification.

In connection with the description of the drawings, like reference numerals may be used for like elements.

The singular expression may include the plural expression unless the context clearly dictates otherwise.

In this document, expressions such as "A or B" or "at least one of A and/or B" may include all possible combinations of items listed together.

Expressions such as "first," "second," or "firstly," or "secondly," can modify the corresponding elements, regardless of order or importance, and are used only to distinguish one from another and do not limit the corresponding components.

When a (e.g., a first) component is referred to as being "(functionally or communicatively) connected" or "coupled" to another (e.g., a second) component, the component may be directly connected to the other component or connected thereto through another (e.g., a third) component.

In this specification, "configured to (or set to)" may be used interchangeably with, for example, "suitable for ~,", "having the ability to ~,", "modified to ~,", "made to ~,", "capable of ~," or "designed to ~," in hardware or software, depending on the context.

In some circumstances, the expression "a device configured to ~" may mean that the device is "capable of ~" together with other devices or parts.

For example, the phrase "a processor configured (or set) to perform A, B, and C" may mean a dedicated processor (e.g. embedded processor) for performing corresponding operations, or a general-purpose processor (e.g., CPU or application processor) capable of performing corresponding operations by executing one or more software programs stored in a memory device.

Also, the term 'or' means 'inclusive or' rather than 'exclusive or'.

That is, unless stated otherwise or clear from the context, the expression 'x uses a or b' means any one of natural inclusive permutations.

In the specific embodiments described above, elements included in the invention are expressed in the singular or plural according to the specific embodiment presented.

However, the singular or plural expression is appropriately selected for the context presented for convenience of description, and the embodiments described above are not limited to the singular or plural components, and even if a component is expressed in plural, it may be configured with a single component, or, even if a component is expressed in a singular, it may be configured with a plurality of components.

Meanwhile, although specific embodiments have been described in the description of the invention, various modifications may be made thereto without departing from the scope of the technical idea contained in the various embodiments.

Therefore, the scope of rights of the invention should not be limited to the described embodiments, but should be defined not only by claims set forth below but also by equivalents to the claims.

FIG. 1 is a diagram for describing a magnetic sensor according to an embodiment.

Referring to FIG. 1, a magnetic sensor 100 according to an embodiment may correct an offset by adjusting a resistance value of a thin film variable resistor through monitoring values of magneto resistors constituting a Wheatstone bridge without an offset correction circuit.

In addition, the magnetic sensor 100 may quickly and easily correct the offset of a sensor through one thin film forming process even when the offset is changed due to environmental noise according to a post-processing step of packaging sensors, or when multiple sensors having different offsets are used.

To this end, the magnetic sensor 100 may include a magnetic field sensing unit 110, a magneto resistor monitoring unit 120, and an offset adjusting unit 130.

The magnetic field sensing unit 110 according to an embodiment may include a plurality of magneto resistors forming a resistance bridge.

For example, a plurality of magneto resistors constitute the Wheatstone bridge, and may include first to fourth magneto resistors respectively provided between a plurality of current terminals and a plurality of voltage terminals provided in the resistance bridge (Wheatstone bridge).

According to one aspect, the magnetic field sensing unit 110 may monitor voltages output through a plurality of voltage terminals, and detect a change in the magnetic field based on the result of monitoring the voltages. In other words, the magnetic field sensing unit 110 may monitor a value of an output voltage (i.e., the voltage output through the plurality of voltage terminals) that changes in response to an external magnetic field, and output the monitored output voltage as a result of detecting the magnetic field by the magnetic sensor 100 according to an embodiment.

The magneto resistor monitoring unit 120 according to an embodiment may monitor resistance values of the plurality of magneto resistors. In other words, the magneto resistor monitoring unit 120 may include a resistance sensing means capable of monitoring resistance values of the first to fourth magneto resistors.

The offset adjusting unit 130 according to an embodiment may adjust the resistance value of the thin film variable resistor connected to at least one terminal among the plurality of current terminals provided in the resistance bridge based on the monitoring result of the resistance values.

According to one aspect, the offset adjusting unit 130 may include a lookup table including resistance control values corresponding to the resistance values of the plurality of magneto resistors (e.g., first to fourth magneto resistors). Also, the resistance value of the thin film variable resistor may be adjusted based on the resistance values of the plurality of magneto resistors monitored through the magneto resistor monitoring unit 120 and the lookup table.

Specifically, in the magnetic sensor, an error occurs in the resistance values of the plurality of magneto resistors due to process problems such as the difference between a thin film forming process for the sensing unit and a thin film forming process for an electrode and non-uniform pattern formation in a lithography process. This error affects the offset of the magnetic sensor, and thus, the existing magnetic sensor had to mount a separate offset correction device to adjust the offset.

On the other hand, in the magnetic sensor 100 according to an embodiment, intermixing noise and thermal drift may be minimized by additionally depositing a thin film resistor on a lower end portion of the resistance bridge without a separate offset correction device and adjusting a length of the thin film resistor (i.e., adjusting the resistance value) based on the monitoring result of the resistance values of the plurality of magneto resistors to correct the offset of the magnetic sensor 100.

The magnetic sensor 100 according to an embodiment will be described in more detail with reference to FIGS. 2A to 6C of the following embodiment.

FIGS. 2A to 2B are diagrams for describing a magnetic sensor according to a first embodiment.

Referring to FIGS. 2A to 2B, FIG. 2A illustrates a diagram for describing a magnetic sensor 200 according to the first embodiment, and FIG. 2B illustrates a diagram for describing in more detail thin film variable resistors (Ra and Rb; 210 to 240) provided in the magnetic sensor 200 according to the first embodiment.

The magnetic sensor 200 according to the first embodiment may include a plurality of magneto resistors R1 to R4 constituting the resistance bridge (Wheatstone bridge), and the thin film variable resistors Ra and Rb connected to at least one terminal among the plurality of current terminals −I terminal and +I terminal provided in the resistance bridge.

For example, the magneto resistors R1 to R4 are respectively provided between the plurality of current terminals −I terminal and +I terminal and the plurality of voltage terminals −V terminal and +V terminal provided in the resistance bridge, and the thin film variable resistors Ra and Rb may be provided between the +I terminal and a current wiring corresponding to the +I terminal.

Specifically, the first magneto resistor R1 may be provided between the +I terminal and the +V terminal, the second magneto resistor R2 may be provided between the −I terminal and the +V terminal, the third magneto resistor R3 may be provided between the −I terminal and the +V terminal, and the fourth magneto resistors R4 may be provided between the +I terminal and the −V terminal.

According to one aspect, the first variable resistor Ra among the thin film variable resistors Ra and Rb may include the first thin film resistor 210 formed from at least one terminal (e.g., +I terminal) in a first direction and a plurality of first resistor electrodes 220 formed on the first thin film resistor 210 at a first interval D1.

In addition, the second variable resistor Rb among the thin film variable resistors Ra and Rb may include the second thin film resistor 230 formed from at least one terminal (e.g., the +I terminal) in a second direction and a plurality of second resistor electrodes 240 formed on the second thin film resistor 230 at a second interval D2 narrower than the first interval D1.

For example, with respect to the magnetic sensor 200, the first direction may be a −x direction, and the second direction may be a +x direction.

In addition, in the thin film variable resistor, each of the plurality of first resistor electrodes 220 and each of the plurality of second resistor electrodes 240 may be formed at an interval of 1 μm to 1,000 μm. Preferably, the first interval D1 between the first resistor electrodes 220 may be 70 μm, and the second interval D2 between the second resistor electrodes 240 may be 35 μm.

Meanwhile, the magnetic sensor 200 may monitor the resistance values of the plurality of magneto resistors R1 to R4 and adjust the resistance value of the thin film variable resistor based on the monitoring result of the resistance values.

According to one aspect, in the magnetic sensor 200, any one electrode of the plurality of first resistor electrodes 220 and any one electrode of the plurality of second resistor electrodes 240 may be connected to a wiring corresponding to at least one terminal (e.g., +I terminal) to which the thin film variable resistors Ra and Rb are connected, based on the monitoring result of the resistance values.

That is, in the magnetic sensor 200, the resistance values of the thin film variable resistors Ra and Rb that are target resistance values for offset correction can be controlled by connecting any one electrode of the plurality of first resistor electrodes 220 to a current wiring corresponding to the +I terminal and connecting any one electrode of the plurality of second resistor electrodes 240 to a current wiring corresponding to the +I terminal based on the monitoring result of the resistance values of the plurality of magneto resistors R1 to R4.

In other words, in the magnetic sensor 200, any one electrode of the plurality of first resistor electrodes 220 and any one electrode of the plurality of second resistor electrodes 240 may be selected to control (i.e., adjust the resistance value) the length of the resistor of the thin film variable resistors Ra and Rb.

More specifically, in the magnetic sensor 200, the resistance values (i.e., lengths) of the thin film variable resistors Ra and Rb can be adjusted in more detail through a first resistance adjustment process of selecting any one electrode of the plurality of first resistor electrodes 220 disposed at a wider first interval, and a second resistance adjustment process (i.e., fine resistance adjustment process) of selecting any one electrode of the plurality of second resistor electrodes 240 disposed at a second interval narrower than the first interval, thereby capable of improving the accuracy and reliability of the offset correction.

According to one aspect, in the magnetic sensor 200, the resistance values of the thin film variable resistors Ra and Rb may be adjusted so that the result obtained by reflecting the resistance value of the third magneto resistor R3 to the resistance value of the first magneto resistor R1 is consistent with the result obtained by reflecting the resistance value of the fourth magneto resistor R4 to the resistance value of the second magneto resistor, based on the monitoring results of the resistance values. In other words, the resistance values of the thin film variable resistors Ra and Rb may be adjusted to be the target resistance values satisfying the condition of 'R1×R3=R2×R4'.

Specifically, in the resistance bridge, if the condition of 'R1×R3=R2×R4' is satisfied, no offset occurs, and when an offset occurs, the above condition is not satisfied. Therefore, the magnetic sensor 200 may compensate for the offset by checking each of the resistance values of the plurality of magnetic storages R1 to R4 and then adjusting the resistance values of the thin film variable resistors Ra and Rb so that the condition described above is satisfied.

FIG. 3 is a diagram for describing an offset compensation characteristic according to a change in the resistance value of the thin film variable resistor provided in the magnetic sensor according to the first embodiment Referring to FIG. 3, the reference numeral 300 illustrates a diagram for describing the characteristics of changes in offset voltage and apparent resistance according to a change in length (0 μm to −600 μm) of the first variable resistor Ra and a change in length (0 μm to 600 μm) of the second variable resistor Rb provided in the magnetic sensor according to the first embodiment. Here, it is assumed that the lengths of the first variable resistor Ra and the second variable resistor Rb do not change at the same time.

At the reference numeral 300, it can be seen that the offset voltage changes as the lengths of the first variable resistor Ra and the second variable resistor Rb change.

That is, in the magnetic sensor according to the first embodiment, the length of the first thin film resistor corresponding to the first variable resistor Ra can be changed by selecting any one electrode of the plurality of first resistor electrodes, and the length of the second thin film resistor corresponding to the second variable resistor Rb can be controlled by selecting any one of the plurality of second resistor electrodes. Through this, the offset of the magnetic sensor may be compensated for in response to the changed lengths (that is, the change in resistance values) of the first thin film resistor and second thin film resistor.

FIGS. 4A to 4B are diagrams for describing a magnetic sensor according to a second embodiment.

Referring to FIGS. 4A to 4B, FIG. 4A illustrates a diagram for describing a magnetic sensor 400 according to the second embodiment, FIG. 4B illustrates a diagram for describing in more detail thin film variable resistors (Ra; 410 to 440) provided in the magnetic sensor 400 according to the second embodiment.

The magnetic sensor 400 according to the second embodiment may include the plurality of magneto resistors R1 to R4 constituting the resistance bridge (Wheatstone bridge), and the thin film variable resistor Ra connected to at least one terminal among the plurality of current terminals −I terminal and +I terminal provided in the resistance bridge.

For example, the magneto resistors R1 to R4 may be provided between the plurality of current terminals −I terminal and +I terminal and the plurality of voltage terminals −V terminal and +V terminal provided in the resistance bridge, respectively, and the thin film variable resistors Ra and Rb may be provided between the +I terminal and the current wirings +I1 wiring and +I2 wiring that correspond to the +I terminal.

Specifically, the first magneto resistors R1 may be provided between the +I terminal and the +V terminal, the second magneto resistors R2 may be provided between the −I terminal and the +V terminal, the third magneto resistor R3 may be provided between the −I terminal and the −V terminal, and the fourth magneto resistor R4 may be provided between the +I terminal and the −V terminal.

According to one aspect, the thin film variable resistor Ra may include a first variable resistor provided with the first thin film resistor 410 connected to a first wiring (e.g., +I1 wiring) formed from at least one terminal (e.g., +I terminal) in a first direction and formed with a first thickness and a plurality of first resistor electrodes 420 formed on the first thin film resistor 410 at a preset interval.

In addition, the thin film variable resistor Rb may include a second variable resistor provided with the second thin film resistor 430 connected to a second wiring (e.g., +I2 wiring) formed in a second direction from at least one terminal (e.g., +I terminal) and formed with a second thickness thicker than the first thickness and a plurality of second resistor electrodes 440 formed on the second thin film resistor 410 at a preset interval.

For example, the plurality of first resistor electrodes 420 and the plurality of second resistor electrodes 440 may be disposed on the first thin film resistor 410 and the second thin film resistor 430 at equal intervals, respectively.

According to one aspect, in the magnetic sensor 400, any one electrode of the plurality of first resistor electrodes 420 and any one electrode of the plurality of second resistor electrodes 440 may be connected to each other based on the monitoring result of the resistance values of the plurality of magneto resistors R1 to R4.

In other words, in the magnetic sensor 400, any one electrode of the first resistor electrodes 420 may be selected to determine the length (i.e., the resistance value of the first variable resistor) of the first thin film resistor 410 corresponding to the selected electrode, any one electrode of the second resistor electrodes 440 may be selected to determine the length (i.e., the resistance value of the second variable resistor) of the second thin film resistor 430 corresponding to the selected electrode, and the selected electrodes can be connected to each other to control the resistance value of the thin film variable resistor Ra to be 'resistance value of first variable resistor+resistance value of second variable resistor'.

More specifically, in the magnetic sensor 400, the resistance value of the thin film variable resistor Ra can be more accurately adjusted through a first resistance adjustment process of adjusting the resistance value of the thin film variable resistor Ra in units of 10Ω by using the first resistor electrode 420 disposed on the first thin film resistor 410 formed with a first thickness and a second resistance adjustment process of adjusting the resistance value of the thin film variable resistor Ra in units of 1Ω by using the second resistor electrode 440 disposed on the second thin film resistor 430 thicker than the first thickness. Through this, the accuracy and reliability of offset correction can be improved.

For a more specific example, in the magnetic sensor 400, as illustrated in FIG. 4B, any one electrode of the plurality of first resistor electrodes 420 is selected so that the resistance value of the first thin film resistor 410 is 60Ω, any one electrode of the plurality of second resistor electrodes 440 is selected so that the resistance value of the second thin film resistor 430 is 5Ω, and the selected electrodes are connected to each other, thereby capable of adjusting the resistance value of the thin film variable resistor Ra to 65Ω (i.e., 60Ω+5Ω).

That is, in the magnetic sensor according to the first embodiment described with reference to FIGS. 2A to 2B, since the resistance value of the thin film variable resistor is adjusted through a ratio of both sides (i.e., the first thin film resistor and the second thin film resistor) of the thin film variable resistor, a non-adjustable resistance value region may be generated.

On the other hand, in the magnetic sensor 400 according to the second embodiment, an adjustable offset range using an absolute resistance value due to structural characteristics of the thin film variable resistor Ra described above may be further subdivided (control of resistance value in units of 10Ω and units of 1Ω). That is, in the magnetic sensor 400 according to the second embodiment, the offset may be more accurately adjusted without the non-adjustable resistance value region, by adjusting the resistance value in units of 1Ω due to an electrical connection such as wire bonding between the +I1 wiring and the +I2 wiring.

In addition, in the magnetic sensor 400 according to the second embodiment, a thin film variable resistor with a smaller size (e.g., the magnetic sensor according to the first embodiment: 10 mm, the magnetic sensor according to the second embodiment: 1.3 mm) than the magnetic sensor according to the first embodiment can be implemented, and the number of resistor electrodes can also be minimized.

According to one aspect, in the magnetic sensor 400, the resistance value of the thin film variable resistor Ra may be adjusted so that the result obtained by reflecting the resistance value of the third magneto resistor R3 to the resistance value of the first magneto resistor R1 is consistent with the result obtained by reflecting the resistance value of the fourth magneto resistor R4 to the resistance value of the second magneto resistor R2, based on the monitoring results of the resistance values. In other words, the resistance value of the thin film variable resistor Ra may be adjusted to be the target resistance value satisfying the condition of 'R1× R3=R2×R4'.

FIG. 5 is a diagram for describing an application example of the magnetic sensor according to the second embodiment Referring to FIG. 5, a magnetic sensor 500 according to the second embodiment may include first thin film variable resistors 510 and 520 connected to the +I terminal and second thin film variable resistors 530 and 540 connected to the −I terminal among the plurality of current terminals −I terminal and +I terminal provided in the resistance bridge.

Specifically, the first thin film variable resistors 510 and 520 may include the first variable resistor 510 and the second variable resistor 520, and the second thin film variable resistors 530 and 540 include the third variable resistor 530 and the fourth variable resistor 540.

In addition, each of the first to fourth variable resistors 510 to 540 may include a thin film resistor having a preset length and a plurality of resistor electrodes formed on the thin film resistor at preset intervals.

According to one aspect, each of the thin film resistors provided in the first to fourth variable resistors 510 to 540 may be formed with a different thickness.

Preferably, the thin film resistor provided in the first variable resistor 510 may be designed to have a thickness for adjusting the resistance value in units of 10Ω, the thin film resistor provided in the second variable resistor 520 may be designed to have a thickness for adjusting the resistance value in units of 1Ω, the thin film resistor provided in the third variable resistor 530 may be designed to have a thickness for adjusting the resistance value in units of 0.1Ω, and the thin film resistor provided in the fourth variable resistor 540 may be designed to have a thickness for adjusting the resistance value in units of 0.01Ω.

That is, in the magnetic sensor 500, the resistance values of the first thin film variable resistors 510 and 520 and the second thin film variable resistors 530 and 540 may be more finely adjusted in units of 10Ω, units of 1Ω, units of 0.1Ω, and units of 0.01Ω based on the monitoring result for the resistance values of the plurality of magneto resistors. Through this, the offset can be adjusted more accurately.

FIG. 6 is a diagram for describing a manufacturing method of the magnetic sensor according to an embodiment.

In other words, FIG. 6 is a diagram for describing the manufacturing method of the magnetic sensor according to the embodiments described with reference to FIGS. 1 to 5. Hereinafter, among the contents described with reference to FIG. 6, descriptions that overlap with those described with reference to FIGS. 1 to 5 will be omitted.

Referring to FIG. 6, in step 610, in the manufacturing method of the magnetic sensor according to an embodiment, a resistance bridge including a plurality of magneto resistors may be formed.

For example, the plurality of magneto resistors may constitute the Wheatstone bridge, and may include first to fourth magneto resistors respectively provided between the plurality of current terminals and the plurality of voltage terminals.

According to one aspect, in step 610, in the manufacturing method of the magnetic sensor according to the embodiment, the resistance bridge may be formed with a magnetic thin film having a double layer structure through DC magnetron sputtering. For example, the double layer structure may be formed of 'Ta (5 nm)/NiFe (10 nm)/IrMn (10 nm)/Ta (5 nm)'.

Next, in step 620, in the manufacturing method of the magnetic sensor according to the embodiment, a first thin film resistor and a second thin film resistor of a thin film type variable resistor may be formed on a wiring connected to at least one terminal among a plurality of current terminals provided in the resistance bridge.

According to one aspect, in step 620, in the manufacturing method of the magnetic sensor according to the embodiment, the first thin film resistor formed from at least one terminal in a first direction and the second thin film resistor formed from at least one terminal in a second direction may be formed.

In addition, in step 620, in the manufacturing method of the magnetic sensor according to the embodiment, the first thin film resistor connected to a first wiring formed from one terminal in a first direction and formed with a preset first thickness, and a second thin film resistor connected to a second wiring formed from at least one terminal in the second direction and formed with a second thickness greater than the first thickness may be formed.

According to one aspect, in the manufacturing method of the magnetic sensor according to the embodiment, the resistance bridge and the first and second thin film resistors may be formed of the same material. In this case, steps 610 and 620 may be integrated and performed in one step.

For example, the first and second thin film resistors may be formed of a material having high specific resistance and ensuring temperature stability and long-term stability, and may preferably include at least one material of manganin and constantan.

Next, in step 630, in the manufacturing method of the magnetic sensor according to the embodiment, a plurality of first resistor electrodes may be formed on the first thin film resistor, and a plurality of second resistor electrodes may be formed on the second thin film resistor.

For example, the first resistor electrode and the second resistor electrode may include at least one material of gold (Au), platinum (Pt), palladium (Pd), silver (Ag), copper (Cu), and nickel (Ni).

According to one aspect, in step 630, in the manufacturing method of the magnetic sensor according to the embodiment, the plurality of first resistor electrodes formed at a first interval may be formed on the first thin film resistor, and the plurality of second resistor electrodes formed at a second interval narrower than the first interval may be formed on the second thin film resistor.

For example, in step 630, in the manufacturing method of the magnetic sensor according to the embodiment, each of the plurality of first resistor electrode and each the plurality of second resistor electrode may be formed at an interval of 1 μm to 1,000 μm. Preferably, the first interval may be 70 μm and the second interval may be 35 μm.

In addition, in step 630, in the manufacturing method of the magnetic sensor according to the embodiment, the plurality of first resistor electrodes formed at a preset interval may be formed on the first thin film resistor, and the plurality of second resistor electrodes formed at a preset interval may be formed on the second thin film resistor. That is, the first resistor electrode and the second resistor electrode may be formed at the same interval.

FIGS. 7A to 7C are diagrams for describing the manufacturing method of the magnetic sensor according to the first embodiment.

The manufacturing method of the magnetic sensor described below with reference to FIGS. 7A to 7C may be performed in steps 610 to 630 of FIG. 6.

Referring to FIGS. 7A to 7C, in step 710, in the manufacturing method of the magnetic sensor according to the first embodiment, the resistance bridge including the plurality of magneto resistors may be formed.

For example, the resistance bridge is a Wheatstone bridge, and may include first to fourth magneto resistors, a plurality of current terminals −I terminal and +I terminal, and a plurality of voltage terminals −V terminal and +V terminal.

Specifically, the first magneto resistor may be provided between the +I terminal and the +V terminal, the second magneto resistor may be provided between the −I terminal and the +V terminal, the third magneto resistor may be provided between the −I terminal and the −V terminal, and the fourth magneto resistor may be provided between the +I terminal and the −V terminal.

Next, in step 720, in the manufacturing method of the magnetic sensor according to the first embodiment, a first thin film resistor 720-1 formed in a first direction from at least one terminal and a second thin film resistor 720-2 formed in a second direction from at least one terminal among the plurality of current terminals −I terminal and +I terminal may be formed.

For example, the first thin film resistor 720-1 and the second thin film resistor 720-2 may be formed in the first direction and the second direction from the +I terminal, respectively Next, in step 730, in the manufacturing method of the magnetic sensor according to the first embodiment, a plurality of first resistor electrodes 730-1 may be formed on the first thin film resistor 720-1, and a plurality of second resistor electrodes 730-2 may be formed on the second thin film resistor 720-2. Here, the first resistor electrodes 730-1 may be formed at a first interval, and the second resistor electrodes 730-2 may be formed at a second interval narrower than the first interval.

Preferably, the first interval between the first resistor electrodes 730-1 may be 70 μm, and the second interval between the second resistor electrodes 730-2 may be 35 μm.

Meanwhile, in step 730, in the manufacturing method of the magnetic sensor according to the first embodiment, a first electrode 730-3, a second electrode 730-4, and a third electrode 730-5 may be formed at positions corresponding to the +V terminal, the −I terminal, and the −V terminal, respectively.

Eventually, if the invention is used, the offset may be corrected by adjusting the resistance value of the thin film variable resistor through the monitoring of the values of the magneto resistors constituting the Wheatstone bridge without the offset correction circuit.

In addition, even when the offset is changed due to environmental noise according to a post-processing step of packaging sensors, or when multiple sensors having different offsets are used, the offset of the sensor can be quickly and easily corrected through one thin film forming process Although the embodiments have been described with reference to the limited drawings as described above, various modifications and variations may be made thereto from the above description by those of ordinary skill in the art. For example, although the techniques described are performed in an order different from the method described, and/or even if the components of the described system, structure, device, circuit, etc. are coupled or combined in a form different from the described method, or replaced or substituted by other components or equivalents thereof, an appropriate result may be achieved.

Therefore, other implementations, other embodiments, and those equivalent to the claims also fall within the scope of the claims to be described later.

What is claimed is:

1. A magnetic sensor comprising:
   a magnetic field sensing unit that is provided with a plurality of magneto resistors forming a resistance bridge;
   a magneto resistor monitoring unit that monitors resistance values of the plurality of magneto resistors; and
   an offset adjusting unit that adjusts a resistance value of a thin film variable resistor connected to at least one terminal among a plurality of current terminals provided in the resistance bridge based on the monitoring result of the resistance values.

2. The magnetic sensor according to claim 1,
   wherein the thin film variable resistor includes
   a first variable resistor provided with a first thin film resistor formed from the at least one terminal in a first direction, and a plurality of first resistor electrodes formed on the first thin film resistor on the first thin film resistor at a first interval, and
   a second variable resistor provided with a second thin film resistor formed from the at least one terminal in a second direction, and a plurality of second resistor electrodes formed on the second thin film resistor at a second interval narrower than the first interval.

3. The magnetic sensor according to claim 2,
   wherein the offset adjusting unit connects any one electrode among the plurality of first resistor electrodes and any one electrode among the plurality of second resistor electrodes to a wiring corresponding to the at least one terminal based on the monitoring result of the resistance values.

4. The magnetic sensor according to claim 2,
wherein, in the thin film variable resistor, each of the plurality of first resistor electrode and each of the plurality of second resistor electrode may be formed at an interval of 1 μm to 1,000 μm.

5. The magnetic sensor according to claim 1,
wherein the thin film variable resistor includes
a first variable resistor provided with a first thin film resistor connected to a first wiring formed from the at least one terminal in a first direction and formed with a first thickness, and a plurality of first resistor electrodes formed on the first thin film resistor at a preset interval, and
a second variable provided with a second thin film resistor connected to a second wiring formed from the at least one terminal in a second direction and formed with a second thickness thicker than the first thickness, and a plurality of second resistor electrodes formed on the second thin film resistor at a preset interval.

6. The magnetic sensor according to claim 5,
wherein the offset adjusting unit connects any one electrode among the plurality of first resistor electrodes and any one electrode among the plurality of second resistor electrodes to each other based on the monitoring result of the resistance values.

7. The magnetic sensor according to claim 1,
wherein the plurality of magneto resistors constitute a Wheatstone bridge, and include first to fourth magneto resistors respectively provided between the plurality of current terminals and a plurality of voltage terminals.

8. The magnetic sensor according to claim 7,
wherein the offset adjusting unit adjusts the resistance value of the thin film variable resistor so that a result obtained by reflecting a resistance value of the third magneto resistor to a resistance value of the first magneto resistor is coincident with a result obtained by reflecting a resistance value of the fourth magneto resistor to a resistance value of the second magneto resistor, based on the monitoring result of the resistance values.

9. The magnetic sensor according to claim 7,
wherein the magnetic field sensing unit monitors voltages output through the plurality of voltage terminals, and detect a change in a magnetic field based on a result of monitoring the voltages.

10. A manufacturing method of a magnetic sensor, the method comprising:
forming a resistance bridge provided with a plurality of magneto resistors;
forming a first thin film resistor and a second thin film resistor of a thin film variable resistor on a wiring connected to at least one terminal among a plurality of current terminals provided in the resistance bridge; and
forming a plurality of first resistor electrodes on the first thin film resistor and forming a plurality of second resistor electrodes on the second thin film resistor.

* * * * *